United States Patent
Garshells

Patent Number: 5,887,335
Date of Patent: *Mar. 30, 1999

[54] METHOD OF PRODUCING A CIRCULARLY MAGNETIZED NON-CONTACT TORQUE SENSOR

[75] Inventor: Ivan J. Garshells, Pittsfield, Mass.

[73] Assignee: Magna-Lastic Devices, Inc., Carthage, Ill.

[*] Notice: The portion of the term of this patent subsequent to Jun. 7, 2015, has been disclaimed.

[21] Appl. No.: 871,985

[22] Filed: Jun. 10, 1997

Related U.S. Application Data

[60] Continuation of Ser. No. 479,394, Jun. 7, 1995, Pat. No. 5,706,572, which is a division of Ser. No. 217,177, Mar. 24, 1994, Pat. No. 5,465,627, which is a division of Ser. No. 736,299, Jul. 29, 1991, Pat. No. 5,351,555.

[51] Int. Cl.$^6$ .......................................................... G01L 3/10
[52] U.S. Cl. ......................................................... 29/602.1
[58] Field of Search ...................... 29/602.1; 73/862.335, 73/862.336

[56] References Cited

U.S. PATENT DOCUMENTS

| | | |
|---|---|---|
| 2,511,178 | 6/1950 | Roters . |
| 3,939,448 | 2/1976 | Garshelis . |
| 4,627,298 | 12/1986 | Sahashi et al. . |
| 4,760,745 | 8/1988 | Garshelis . |
| 4,805,466 | 2/1989 | Schiessle et al. . |
| 4,882,936 | 11/1989 | Garshelis . |
| 4,891,992 | 1/1990 | Kobayashi et al. . |
| 4,896,544 | 1/1990 | Garshelis . |
| 4,899,598 | 2/1990 | Gumaste et al. . |

FOREIGN PATENT DOCUMENTS

| | | |
|---|---|---|
| 0162957 | of 0000 | European Pat. Off. . |
| 0270122 | of 0000 | European Pat. Off. . |
| 0352187 | of 0000 | European Pat. Off. . |
| 0422702 | of 0000 | European Pat. Off. . |
| 1115051 | of 0000 | Germany . |
| 59009528 | of 0000 | Japan . |
| 59-192930 | 11/1984 | Japan . |
| 2167565 | of 0000 | United Kingdom . |
| 9001781 | of 0000 | WIPO . |

OTHER PUBLICATIONS

Garshelis, "A Study of the Inverse Wiedemann Effect on Circular Remanence," IEEE Trans. on Magn., MAG–10 No. 2 344–58 (1974).

Garshelis, "The Weidemann Effects and Applications," IEEE Applied Magnetics Conference, 75 CH0964–7 MAG, 38 pages (1975).

Garshelis, "Conditions for Stress Induced Bulk Moments," J. Appl. Phys. 50(3), 1680–2 (1979).

(List continued on next page.)

Primary Examiner—Carl E. Hall
Attorney, Agent, or Firm—Sixbey, Friedman, Leedom & Ferguson, PC; Stuart J. Friedman

[57] ABSTRACT

A torque sensor comprises a magnetoelastically active element, and a magnetic sensor, such as a Hall effect sensor, responsive to the field of the magnetoelastically active portion. In the preferred embodiment, the magnetoelastically active portion comprises a ring of material endowed with an effective uniaxial magnetic anisotropy such that the circumferential direction is the easy axis, and magnetically polarized in a substantially circumferential direction. The ring is attached to the torqued member, such as a rotating shaft, so that application of a torque to the shaft is transmitted to the ring. The torque on the ring reorients the circumferential magnetic orientation of the ring, producing a helical magnetic orientation having both circumferential and axial components. A magnetic field vector sensor is mounted on a flux collector in a fixed position relative to the ring and oriented so that it responds to the field arising from the axial component of the magnetization within the ring. The output of the sensor is thus proportional to the change in orientation of the magnetization resulting from torque applied to the shaft and transmitted to the ring.

11 Claims, 7 Drawing Sheets

OTHER PUBLICATIONS

Garshelis, "A Versatile Magnetostrictive Displacement Transducer," IEEE Industrial Electronics Control Instrumentation Conference, 76 CH1 117–1 IECI, 99–105 (1976).

Y. Nonomura, E.A., "Measurements of Engine Torque with the Inter–Bearing Torque Sensor," SAE Technical Paper 1988, pp. 2.329–2.339.

G. Reiniger, "Halbleitersensoren Fur Massenmarkte," Elektrotechnik, Jan., 1985, Wurzburg DE, pp. 199–202.

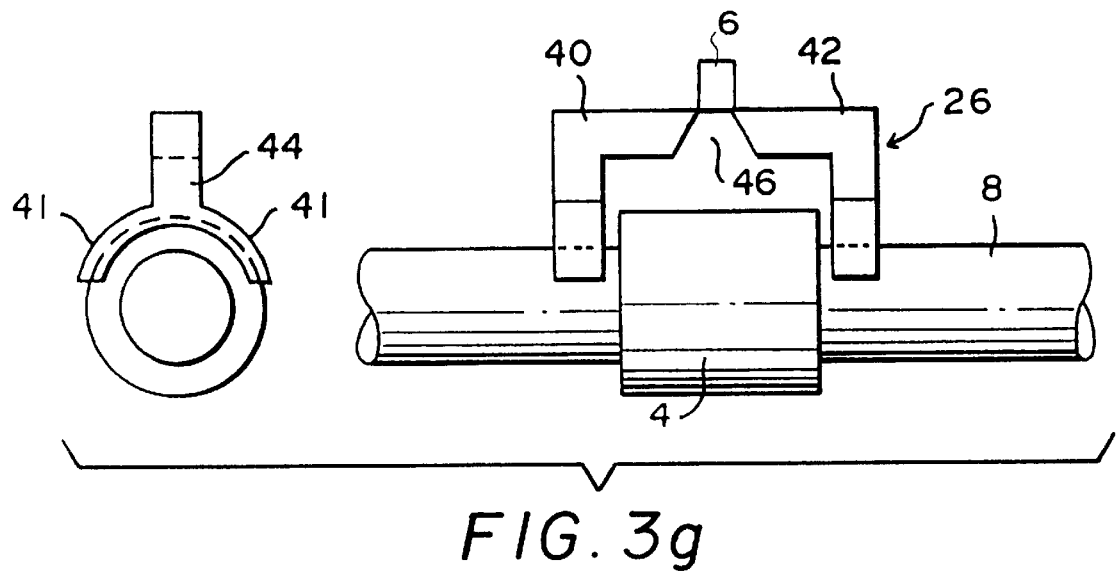
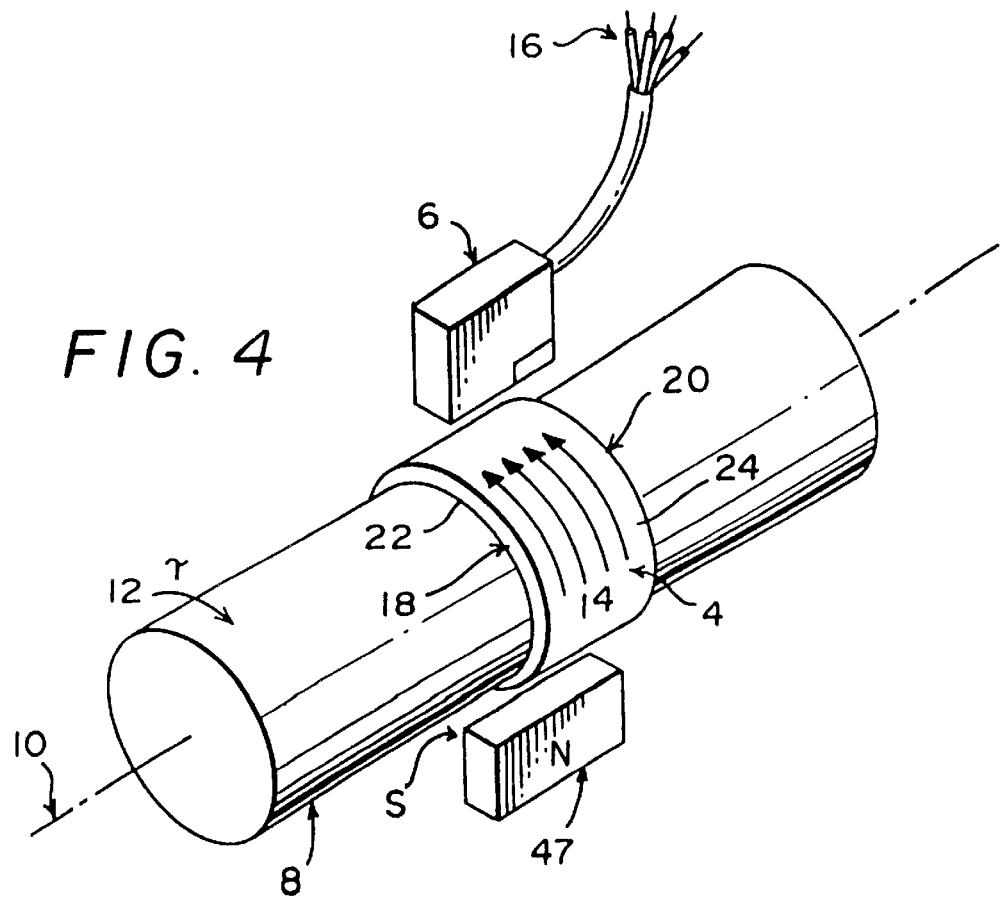

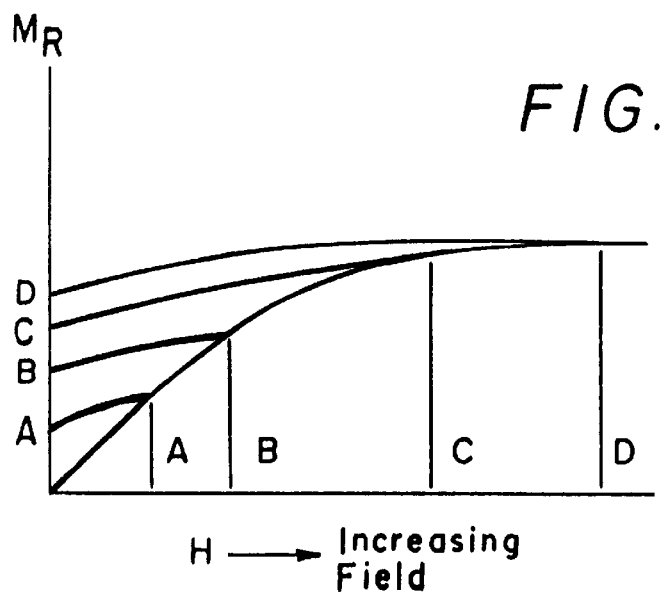
FIG. 5a
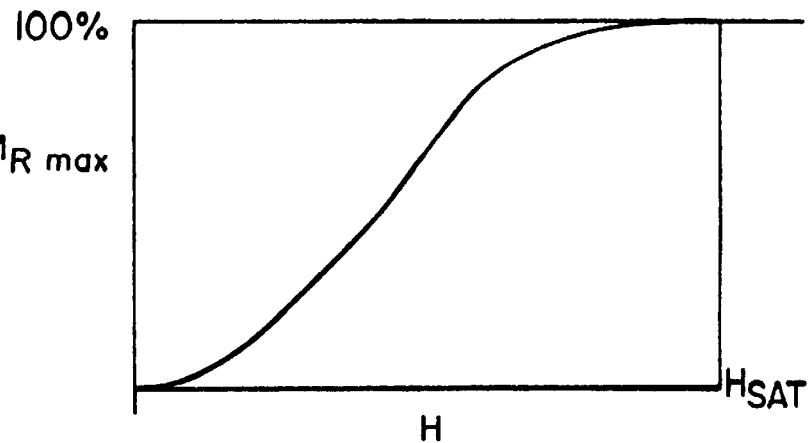
FIG. 5b
FIG. 6
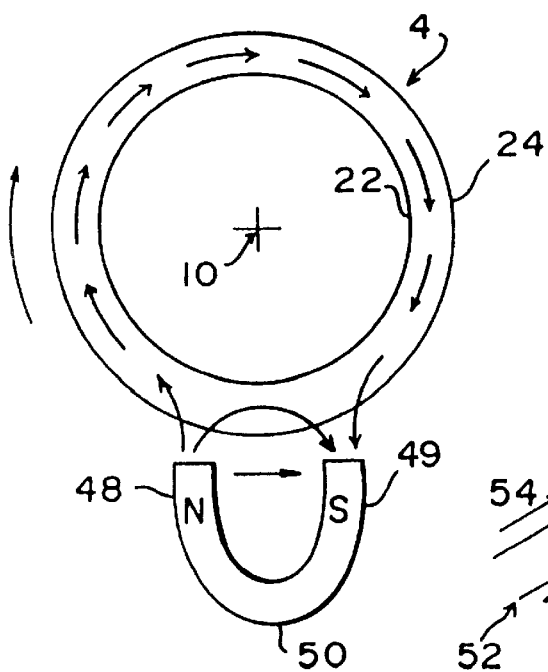
FIG. 7
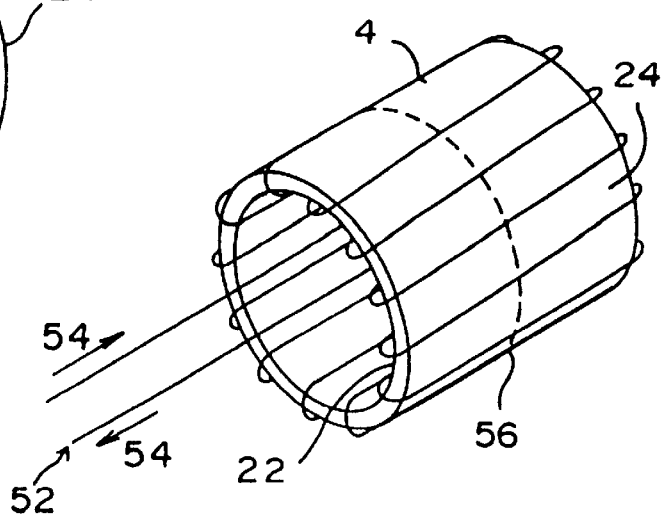

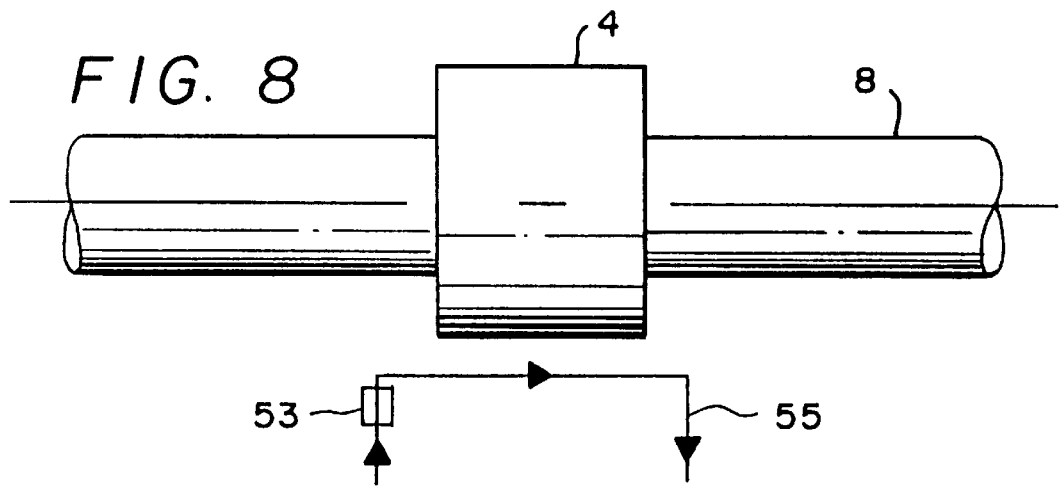
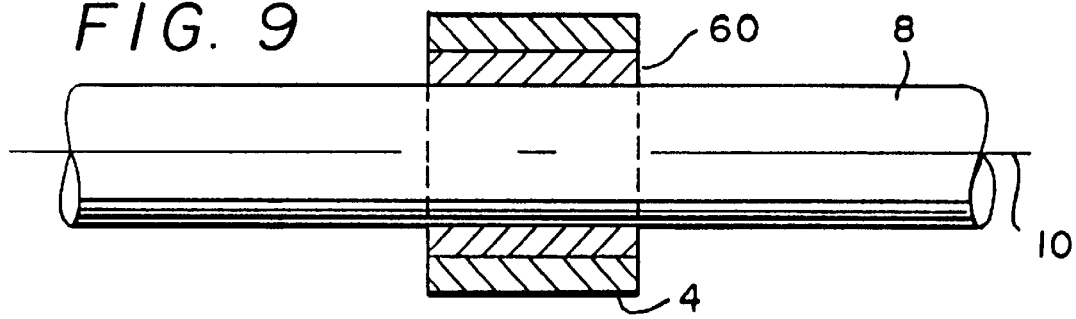
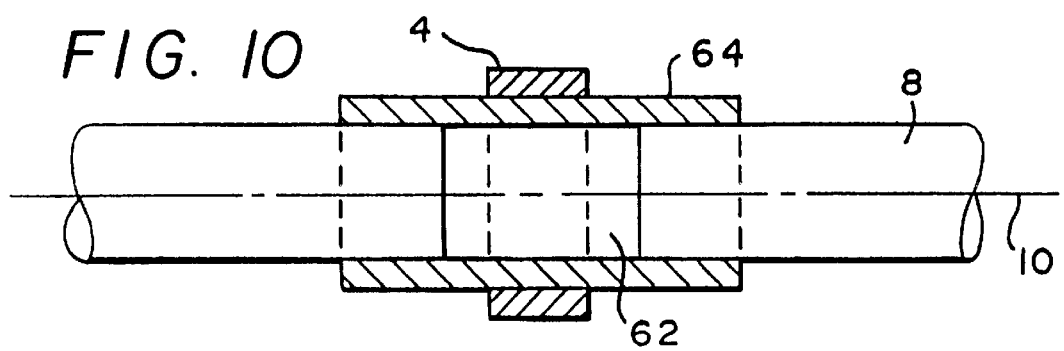
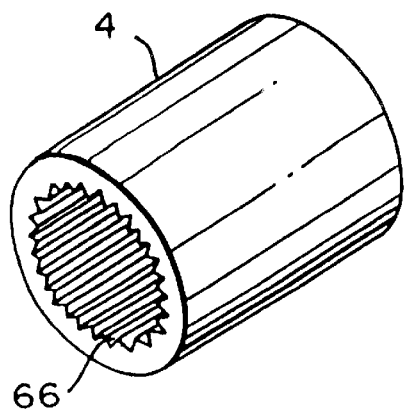
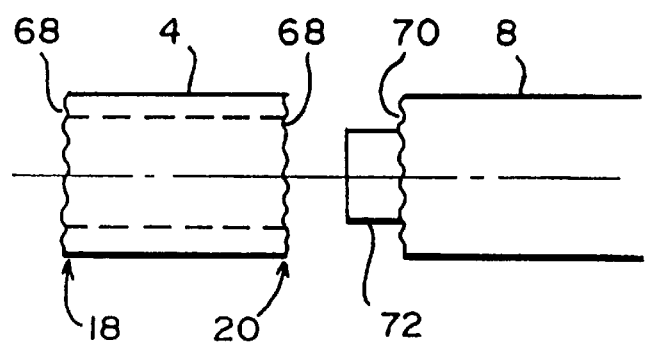

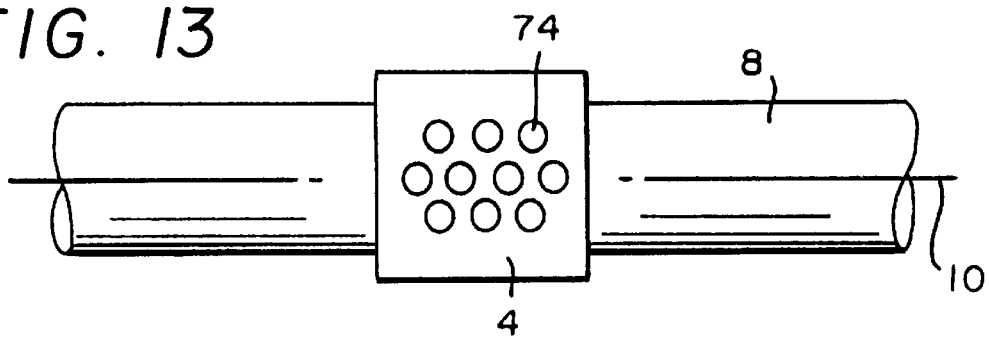
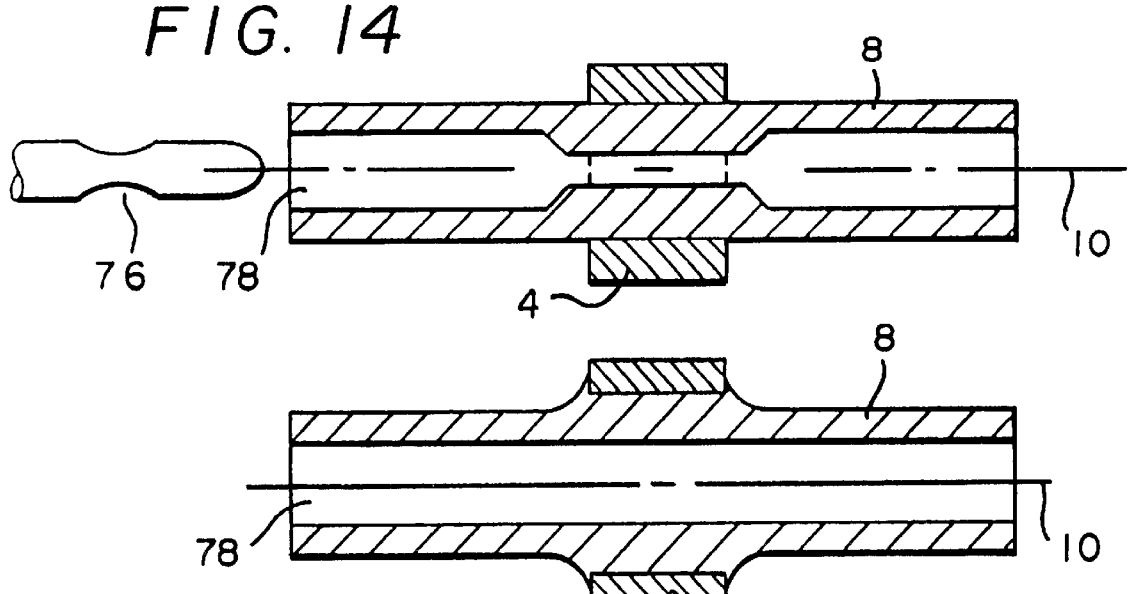
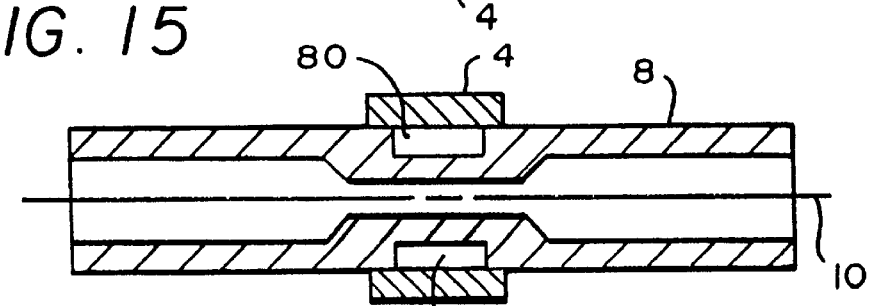

METHOD OF PRODUCING A CIRCULARLY MAGNETIZED NON-CONTACT TORQUE SENSOR

This is a continuation application of Ser. No. 08/479,394, filed Jun. 7, 1995, now U.S. Pat. No. 5,706,572 which is a divisional application of Ser. No. 08/217,177, filed Mar. 24, 1994, now U.S. Pat. No. 5,465,627, which, in turn, is a divisional of Ser. No. 07/736,299, filed Jul. 29, 1991, now U.S. Pat. No. 5,351,555.

FIELD OF THE INVENTION

The present invention relates to torque sensors and, more particularly, to non-contacting magnetoelastic torque transducers for providing a measure of the torque applied to a rotating shaft.

BACKGROUND OF THE INVENTION

In the control of systems having rotating drive shafts, torque and speed are the fundamental parameters of interest. Therefore, the sensing and measurement of torque in an accurate, reliable and inexpensive manner has been a primary objective of workers for several decades. With the relatively recent development of prototype electric power steering systems in which an electric motor driven in response to the operation of a vehicle steering wheel controls the production torque by control of the supply current thereto, the need for a torque sensing apparatus which can accurately detect a torque produced by a steering shaft has been highlighted. Although great strides have been made, there remains a compelling need for inexpensive torque sensing devices which are capable of continuous torque measurements over extended periods of time despite severe environments and operating conditions.

Previously, torque measurement was accomplished using contact-type sensors directly attached to the shaft. One such sensor is a "strain gauge" type torque detection apparatus, in which one or more strain gauges are directly attached to the outer peripheral surface of the shaft and a change in resistance caused by strain is measured by a bridge circuit or other well known means. However, contact-type sensors are relatively unstable and of limited reliability due to the direct contact with the rotating shaft. In addition, they are very expensive and are thus commercially impractical for competitive use on vehicle steering systems.

More recently, non-contact torque sensors of the magnetostrictive type have been developed for use with rotating shafts. For example, U.S. Pat. No. 4,896,544 to Garshelis discloses a sensor comprising a torque carrying member, with an appropriately ferromagnetic and magnetostrictive surface, two axially distinct circumferential bands within the member that are endowed with respectively symmetrical, helically directed residual stress induced magnetic anisotropy, and a magnetic discriminator device for detecting, without contacting the torqued member, differences in the response of the two bands to equal, axial magnetizing forces. Most typically, magnetization and sensing are accomplished by providing a pair of excitation or magnetizing coils overlying and surrounding the bands, with the coils connected in series and driven by alternating current. Torque is sensed using a pair of oppositely connected sensing coils for measuring a difference signal resulting from the fluxes of the two bands. Unfortunately, providing sufficient space for the requisite excitation and sensing coils on and around the device on which the sensor is used has created practical problems in applications where space is at a premium. Also, such sensors appear to be impractically expensive for use on highly cost-competitive devices such as vehicle steering systems.

The output signals of prior art non-contact magnetoelastic torque transducers arise as a result of changes in a magnetic property of a member which is so positioned as to be mechanically stressed, in a usefully correlative manner, by the torque of interest. In all such prior art devices the magnetic property effectively sensed is a permeability $\mu$, of one form or another. This can be understood from the fact that the output signals of these devices are derived from a magnetic flux density B of a flux which arises in response to an excitation field H with $B=\mu H$. While $\mu$ is clearly alterable by the stress and hence by the transmitted torque, its actual value for any particular stress is largely dependent on both intrinsic and structural properties of the magnetoelastically active material forming the member as well as on its temperature. Moreover $\mu$ is also strongly dependent on H, in a manner that is neither linear nor monotonic. The effective field H is itself sensitive to the amplitude and frequency of the electric currents from which it is generally derived as well as the distribution of permeances of the associated magnetic circuit. Temperature effects on coil resistance, air gap dimensions, leakage flux associated with permeabilities of yokes and other ancillary portions of the magnetic circuit, dielectric constants of parasitic capacitances between windings and other conductive elements and other factors as well, can all have significant influence on the sensed value of B independently of variations in torque. The basic weakness in this prior art approach to magnetoelastic torque transducers is thus seen to be that the sensed quantity, i.e., B, has a large and complex dependence on many variables and a comparatively small dependence on torsional stress with the undesirable result that the sensed variations in B do not unambiguously indicate a variation in torque.

Attempts to overcome this problem with prior art devices employ constructions providing two distinct B dependent signals, having equal quiescent values but opposite responses to torque, with means for combining the two signals differentially; the idea being to reject common mode variations in B while doubling the sensitivity to changes associated with the torque. The requirement for a zero output signal with zero applied torque demands great care in establishing precise symmetry in the two B sensors and precise equality in both the quiescent $\mu$ in the two regions of the member being probed and in the exciting fields. The complexities associated with realizing the sought for benefits of these constructions, in the sensor portion itself as well as in the associated electronic circuits required for providing temperature compensating excitation currents and signal conditioning, increases both the cost and the size of a complete transducer while also generally reducing its adaptability, maintainability and reliability.

SUMMARY OF THE INVENTION

Therefore, it is an object of the present invention to provide a magnetoelastic torque transducer which depends for its operation on the sensing of a quantity that is inherently zero when the torque being measured is zero and Which changes in both direction and magnitude in a correlative manner with the torque being measured.

Another object of the invention to provide a magnetoelastic torque transducer in which the zero value of the sensed quantity under zero torque conditions is substantially unaffected by temperature, angular position of a rotating torqued member, its rotational velocity and any radial or longitudinal air gaps between the torqued member and the quantity sensing means.

It is a still further object of this invention to provide a magnetoelastic torque transducer which requires no excitation field.

Yet another object of the invention is to provide a magnetoelastic torque transducer which requires neither exciting currents nor coils.

It is still another object of the invention to provide a magnetoelastic torque transducer comprising a magnetoelastically active portion which has been endowed with an effective uniaxial magnetic anisotropy having the circumferential direction as the easy axis, and magnetically polarized in a substantially circumferential direction.

A further object of this invention is to provide a magnetoelastic torque transducer which requires neither exciting currents nor coils, and in which the sensed quantity is converted into an electrical output signal by solid state devices.

It is also an object of the invention to provide a magnetoelastic torque transducer which requires neither exciting currents nor coils, in which the integrated circuit device includes means for compensating for variations in the transfer function arising from variations in temperature.

Another object of the invention is to provide a magnetoelastic torque transducer which requires neither exciting currents nor coils, in which an integrated circuit device provides compensation for expanding the range over which output is linear.

An additional object of the invention is to provide a magnetoelastic torque transducer which requires neither exciting currents nor coils, is simple, can be constructed at low cost, is suitable for applications requiring extreme reliability, e.g., for sensing the torque input to a steering system of a motor vehicle.

A further object of the present invention is to provide a non-contact method for measuring torque comprising the steps of: attaching to a rotating torqued member a circumferential transducer endowed with an effective uniaxial magnetoelastic anisotropy and magnetically polarized in the circumferential direction, which produces a field varying in response to stress on the transducer, and measuring a component of field output of the transducer as an indication of torque on the rotating torqued member.

These objects and others are achieved by providing a torque sensor comprising a magnetoelastically active element, and a magnetic sensor, such as a Hall effect sensor, responsive to the field of the magnetoelastically active portion. In the preferred embodiment, the magnetoelastically active portion comprises a ring of material endowed with an effective uniaxial magnetic anisotropy such that the circumferential direction is the easy axis, and magnetically polarized in a substantially circumferential direction. The ring is attached to the torqued member, such as a rotating shaft, so that application of a torque to the shaft is transmitted to the ring. The torque on the ring reorients the circumferential magnetic orientation of the ring, producing a helical magnetic orientation having both circumferential and axial components. A magnetic field vector sensor is mounted in a fixed position relative to the ring and oriented so that it responds to the field arising from the axial component of the magnetization within the ring. The magnetic field vector sensor may be mounted on a flux collector if desired. The output of the sensor is thus proportional to the change in orientation of magnetization in the ring resulting from torque applied to the shaft and transmitted to the ring.

BRIEF DESCRIPTION OF THE DRAWINGS

FIGS. 3a through 3g are views of various embodiments of the present invention incorporating a magnetic flux collection yoke;

FIG. 4 is an assembly drawing showing a refresh magnet installed for use in conjunction with the sensor of the present invention;

FIGS. 5a and 5b are graphs showing the effect of an increasing polarizing field on remanent magnetism in the transducer of the present invention;

FIG. 6 is a diagram showing magnetic polarization of the transducer of the present invention by rotation through the field of a magnet;

FIG. 7 is a diagram showing magnetic polarization of the transducer of the present invention by passing current through a toroidally wound conductor;

FIG. 8 is a diagram showing magnetic polarization of the transducer of the present invention by translation of a magnet along the outside of the transducer;

FIG. 9 is a sectional view showing a low permeability spacer installed between the transducer of the present invention and a machine shaft;

FIG. 10 is a sectional view showing a connecting sleeve installed over a cut-away portion of a machine shaft, upon which the transducer is then installed;

FIG. 11 is a perspective view of a transducer having grooves cut on its inner surface in the direction of its longitudinal axis for engaging similar structures on a shaft;

FIG. 12 is a plan view of a transducer having grooves cut on its edges for engaging similar structures on a shaft;

FIG. 13 is a plan view of a transducer having perforations about its circumference for receiving transducer-shaft bonding adhesive;

FIG. 14 illustrates internal expansion fitting of the transducer of the present invention to a shaft using a mandrel;

FIG. 15 shows the assembly of FIG. 14 following expansion of the shaft; and

FIG. 16 shows a shaft structure suitable for use with the internal expansion process of FIG. 14 which is cut down in a center region to minimize expansion of transducer 4 in the central axial region.

DETAILED DESCRIPTION OF THE PREFERRED EMBODIMENTS

Figure 1:
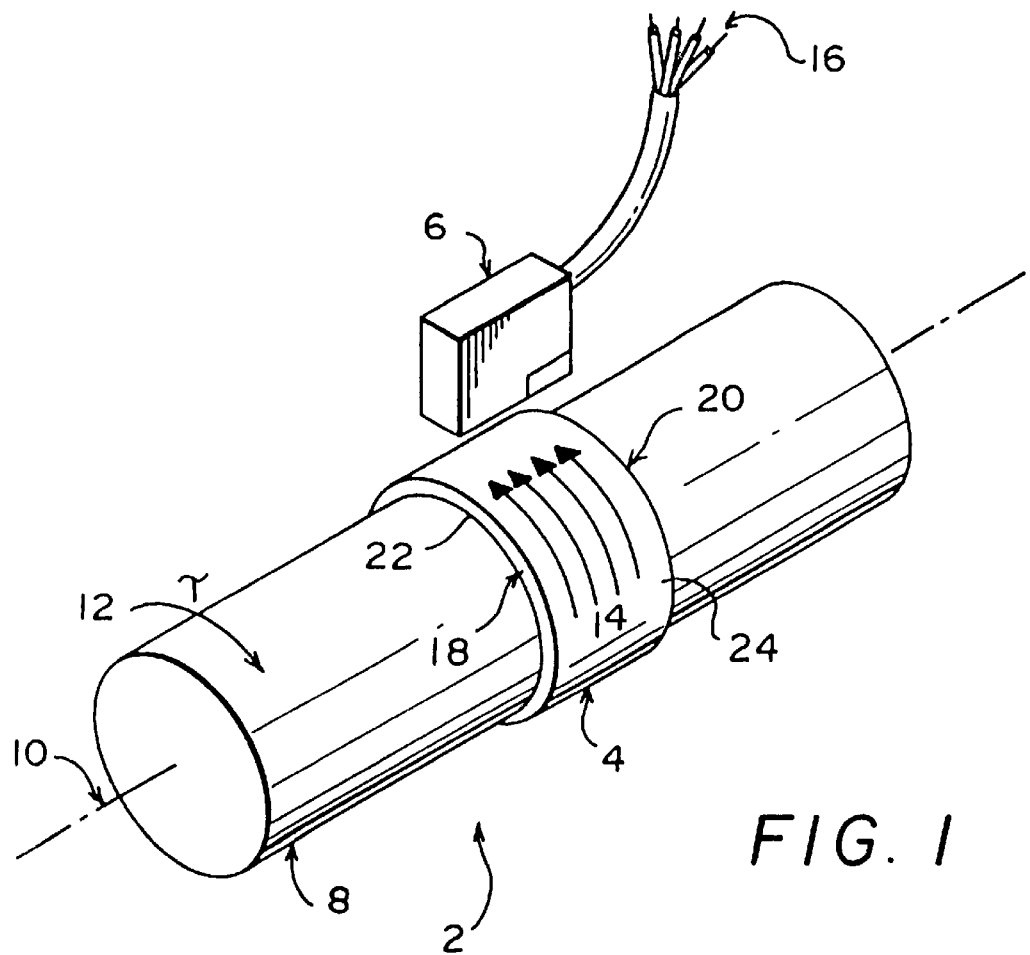
FIG. 1 is an assembly drawing showing the sensor of the present invention.

Referring first to FIG. 1, a torque sensor according to the present invention is shown generally at 2. Torque sensor 2 comprises transducer 4 and magnetic field vector sensor 6. Torque sensor 2 is mounted on a shaft 8 which is part of a machine (not shown) and rotates about a central longitudinal axis 10. Torque 12 is applied at one portion of shaft 8 and is transmitted thereby to another portion of the shaft where the motion of shaft 8 due to torque 12 performs some useful work. Torque 12 is shown as being in a clockwise direction looking at the visible end of shaft 8, but obviously can be applied to rotate the shaft in either or both directions depending on the nature of the machine incorporating shaft 8.

Transducer 4 is firmly attached to shaft 8 in one of a number of ways to be explained in detail later, and acts as a means for providing an axially or radially identifiable, magnetoelastically active region on the shaft 8. In practice, transducer 4 will generally take the form of a cylindrical sleeve or ring with end faces 18 and 20, inner surface 22, and outer surface 24, suitably attached to shaft 8 at a convenient location along axis 10 which is within the torsionally stressed region of shaft 8. Transducer 4 is endowed, by prior processing or as a collateral effect to the means of attachment to shaft 8, with an effective uniaxial magnetic anisotropy having the circumferential direction as the easy axis. In addition, transducer 4 will also be magnetically polarized in one or the other circumferential direction by any effective method, several of which will be later described. Briefly, transducer 4 is magnetically polarized in a substantially purely circumferential direction 14, at least to the extent that, in the absence of torque 12 (in a quiescent state), it has no net magnetization component in the direction of axis 10 and has no net radial magnetization components. Thus, domains whose magnetizations originally had components in the opposite circular sense are substantially eliminated. If the circular anisotropy is suitably dominant, all of the domain magnetizations will lie within at most a plus or minus 45° limit, and will be symmetrically distributed within small enough volumes of the ring to ensure that no uncompensated external flux is sensable by magnetic field vector sensor 6. The closed cylindrical shape of transducer 4 enhances the stability of the polarization of transducer 4 by providing a complete circuit.

As will be seen, due to the construction and processing of transducer 4, application of torsional stress to shaft 8 and thus to transducer 4 causes reorientation of the polarized magnetization in transducer 4. The polarized magnetization becomes increasingly helical as torsional stress increases. The helicity of the magnetization in transducer 4 depends on the magnitude of the transmitted torque 12, and the chirality is dependent on the directionality of the transmitted torque and the magnetoelastic characteristics of transducer 4. The helical magnetization resulting from torsion of transducer 4 has both a circumferential component in direction 14 and an axial component along axis 10. Of particular importance is that the magnitude of the axial component depends entirely on the torsion in transducer 4.

Magnetic field vector sensor 6 is a magnetic field vector sensing device located and oriented relative to transducer 4 so as to sense the magnitude and polarity of the field arising in the space about transducer 4 as a result of the reorientation of the polarized magnetization from the quiescent circumferential direction to a more or less steep helical direction. Magnetic field vector sensor 6 provides a signal output reflecting the magnitude of torque 12. In a preferred embodiment, magnetic field vector sensor 6 is an integrated circuit Hall effect sensor. Wires 16 connect magnetic field vector sensor 6 to a source of direct current power, and transmit the signal output of magnetic field vector sensor 6 to a receiving device (not shown), such as a control or monitoring circuit for the machine or system incorporating shaft 8.

Because of symmetry in the case of domains of transducer 4 which are not precisely circumferentially polarized, and because of the pure circularity of other magnetic orientation in other domains, there is no sensable field in the space external to the quiescent, untorqued transducer 4. Indeed, there is no passive external means of discerning that the transducer 4 is in fact polarized. The action of the biaxial principal stresses associated with the transmission of torque, via the intrinsic magnetoelastic interaction of the material of transducer 4, adds an additional anisotropic influence to the equilibrium orientation of each domain's magnetization, altering the effective easy axis direction of every domain towards the nearest positive principal stress (the stress being tensile in materials with positive magnetostrictions, and compressive in materials with negative magnetostrictions). Since, in the untorqued state, by virtue of the endowed anisotropy and the circular polarization, all domains have magnetizations which lie within an arc of 90°, the effective easy axis direction of each domain is altered toward the circumferential direction. The original symmetry or pure circularity of the magnetization is thus broken by the application of torque so that a net helicity appears in the magnetization within transducer 4. This helicity, combined with the single circular sense of the polarization, results in a magnetization that may be resolved into two components: a circumferential component and an axial component. While the circumferential component is, as has already been mentioned, not a source of detectable fields in the space external to the transducer 4, the axial component can be readily detected. Transducer 4, when torqued, generates a field externally indistinguishable from that of a tubular bar magnet, with the bar magnet's axial magnetization equal to the volumetrically averaged axial component of the helically directed magnetization of each domain. Thus, the direction of applied torque determines (together with the sign of the effective magnetostriction of the transducer 4 material) the polarity of the equivalent bar magnet, and the magnitude of the torque determines the strength of the equivalent bar magnet.

Figure 3A:
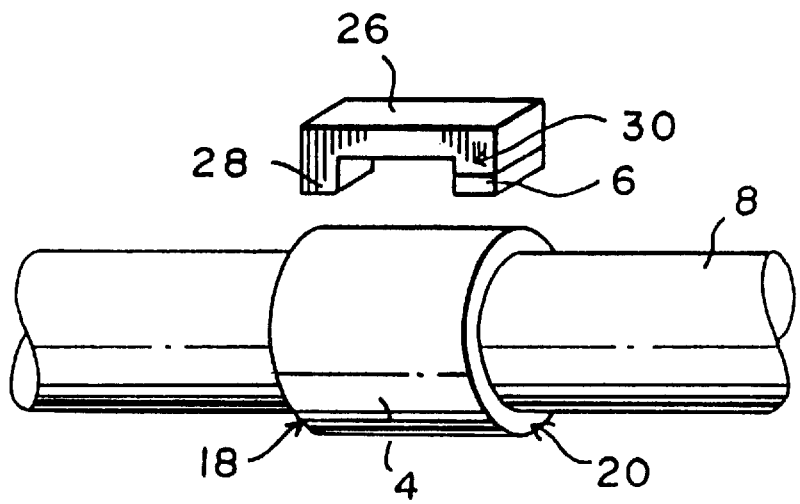

Referring now to FIGS. 3a through 3g, in the preferred embodiment, a yoke 26 of magnetically soft (low coercive force, high permeability) material is provided in conjunction with the magnetic sensor or sensors 6. Yoke 26 is a means for increasing the permeance of the flux closure path through the magnetic field vector sensor 6, and is also a means for collecting flux from circumferential portions of transducer 4 which are farther from magnetic field vector sensor 6. The yoke 26 is particularly useful with Hall effect integrated circuits, since these devices tend to have relatively high noise levels, increasing with decreasing frequency. Thus, it is preferable to operate these devices using higher rather than lower field strengths to increase the S/N (signal/noise) ratio. As shown in FIG. 3a, magnetic field vector sensor 6 is preferably located near the edge 18 (or edge 20) of transducer 4, since the orientation of the magnetic field from transducer 4 dictates that greater field intensity will be present near the edges 18 and 20 of transducer 4 than in other regions proximate to transducer 4. In this embodiment, yoke 26 is a generally bar-shaped flux collector disposed on one side of transducer 4 and shaft 8. Yoke 26 has projections 28 and 30 at its ends proximate to edges 18 and 20 of transducer 4. Magnetic field vector sensor 6 is mounted on projection 30 between yoke 26 and transducer 4.

Figure 3B:
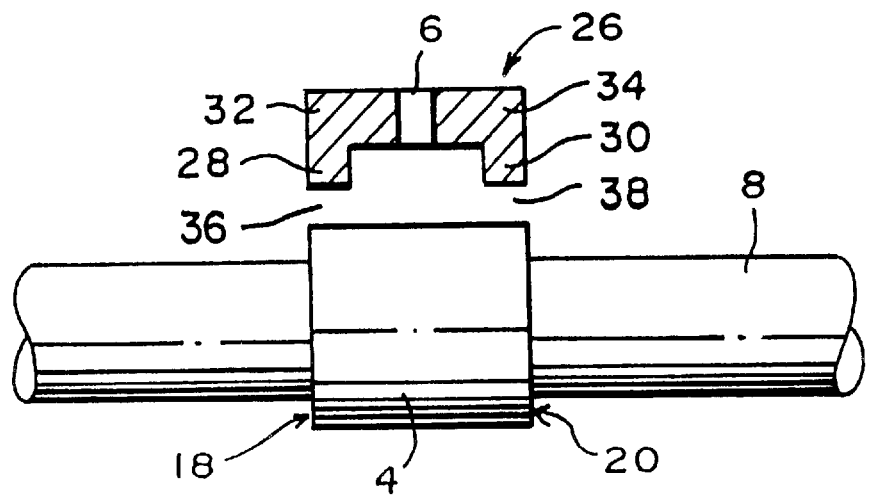

FIG. 3b shows a yoke 26 composed of two segments 32 and 34, with projections 28 and 30 respectively extending toward transducer 4. Magnetic field vector sensor 6 is located axially (with respect to shaft 8) between yoke segment 32 and yoke segment 34, completing a magnetic path from edge 18 of transducer 4 through air gap 36, yoke segment 32, magnetic field vector sensor 6, yoke segment 34, air gap 38, to edge 20 of transducer 4.

Figure 3C:
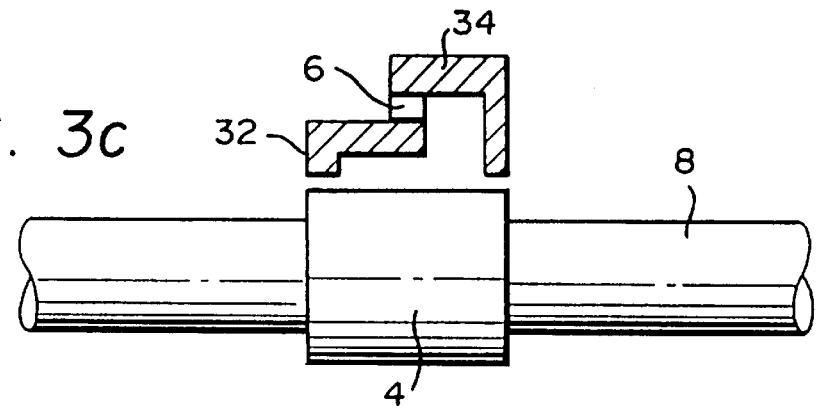

FIG. 3c shows another embodiment of yoke 26, generally similar to the embodiment of FIG. 3b, in which magnetic field vector sensor 6 is located radially between yoke segments 32 and 34; that is, the magnetic path passes from yoke segment 32 radially outward with respect to shaft 8, through magnetic field vector sensor 6, and further radially outward to yoke segment 34.

Figure 3D:
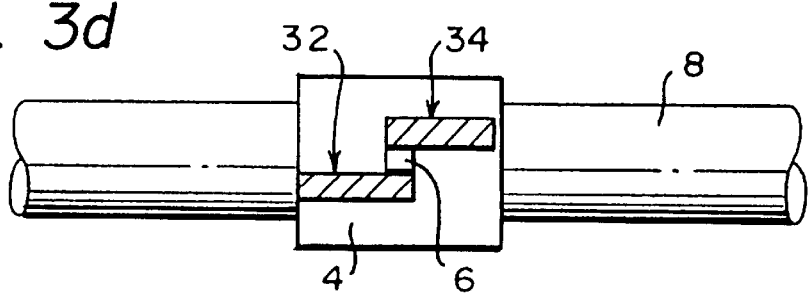

FIG. 3d is a top view of another embodiment of yoke 26. The embodiment of FIG. 3d is similar to the embodiment of FIG. 3c, but in this embodiment yoke segments 32 and 34 are bar-shaped and are aligned proximate to the outer surface 24 of transducer 4, along different central axes, each axis parallel to axis 10 of shaft 8. Magnetic field vector sensor 6 is located between the ends of yoke segments 32 and 34. Thus, the path from yoke segment 32 to yoke segment 34 through magnetic field vector sensor 6 is circumferential about transducer 4 and shaft 8, and transverse to the central longitudinal axes of yoke segments 32 and 34.

Figure 3E:
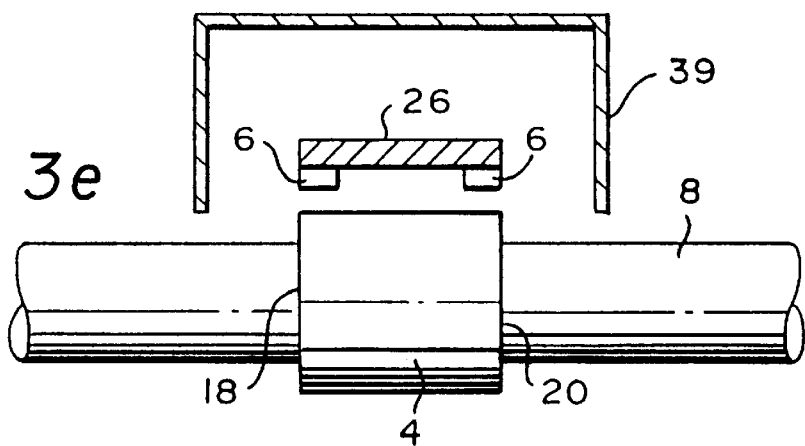
Figure 3F:
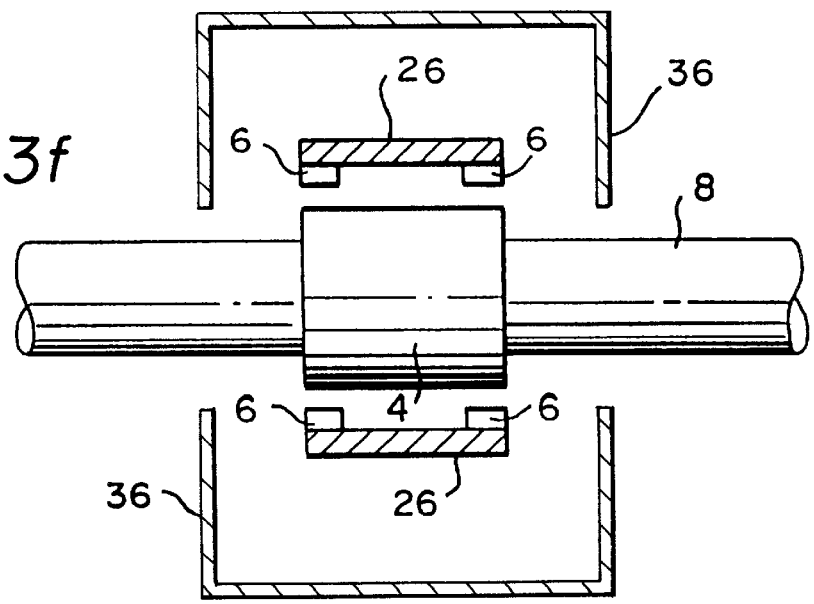

FIG. 3e shows yet another embodiment of the present invention in which two magnetic sensors 6 are used. The magnetic sensors 6 are disposed at opposite ends of transducer 4, near edges 18 and 20 respectively, and are connected by a simple bar-shaped yoke 26. Multiple sensor embodiments increase the cost of the device, but are desirable because the magnetic sensors 6 can be connected differentially for common mode rejection of temperature variations, voltage variations, and ambient field signals. Optionally, to minimize ambient field effects, magnetic sensors 6 may be shielded by a shield 39, made of any material having very low magnetic permeability. Shield 39 may surround magnetic sensors 6 in all directions other than the direction of flux received from transducer 4.

Of course, a larger number of magnetic sensors 6 could also be used if desired. In the embodiment shown in FIG. 3f, four magnetic sensors 6 are used, with two disposed diametrically opposite to the other two with respect to transducer 4.

FIG. 3g shows yet another embodiment of the sensor 2 of the present invention. In this embodiment, yoke 26 is made up of two right-angle bar-shaped segments 40 and 42. Legs 44 of segments 40 and 42 terminate proximate to the shaft 8 in the region of edges 18 and 20 of transducer 4. At their terminations, legs 44 join a circumferential portion 41 of yoke 26. Circumferential portions 41 may surround part or all of the shaft 8 and gather flux from a circumferential region. The flux is led up a leg 44 to a small tapered air gap 46 where "fringing" flux is directed through magnetic field vector sensor 6 to the other of segments 40 and 42. Gap 46 is preferably on the order of a few thousandths of an inch, or less, across at its narrowest point, thus providing an intense field in the region. While this gap is axial, similar arrangements could also use gaps oriented radially or circumferentially with respect to transducer 4.

The yokes 26 shown in FIGS. 3a through 3g perform several useful functions. Besides concentrating the flux gathered from a larger area and directing it to or through magnetic field vector sensor 6, yokes 26 reduce the effects of any inhomogeneity in the axial magnetic moment which might exist at different circumferential locations around the transducer 4. In extreme cases of such inhomogeneity or radial runout (eccentricity) of the shaft it may also be desirable to provide a yoke 26 that fully encircles transducer 4. Such a yoke might be made from coaxial rings of soft magnetic material near each end of, but radially separated from, transducer 4. The flux gathering pieces would be firmly attached (with minimum interfacial gaps) to other pieces of yoke 26 configured to lead the gathered flux to the magnetic field vector sensor 6.

Experimentation with the polarized transducer 4 according to the present invention suggests that its magnetic properties are stable over time, temperature excursions, vibration (stress in various modes) and continued torque cycling. In particular, the polarized transducer 4, with its closed ring shape, is in the lowest possible energy state and therefore the most stable state. In the demagnetized condition, there is potential energy in the domain walls as well as in local stresses due to "misfit" of domains having non-coherent spontaneous magnetostrictions and in the microscopic fields in the vicinity of regions where the local magnetization changes direction.

Should any problem be encountered with long-term stability of the fields generated by transducer 4, a fixed refresh magnet 47 can be provided in the machine or system proximate to the rotating transducer 4, as illustrated in FIG. 4. Addition of this magnet component provides a continual low-level magnetic force on transducer 4 which tends to maintain the desired polarization of transducer 4. Magnet 47 can be relatively weak since it need not be strong enough to actually polarize the entire transducer 4, but must only be able to correct any wayward domains which develop during extended operation of the device in the field. A small bonded ferrite magnet 47 with length approximately equal to the length of transducer 4 along axis 10 and magnetized across its thickness (with N pole on one face and S pole on the other as shown) can be used.

Magnetic Sensor Construction

Magnetic field vector sensor 6 preferably comprises one or more solid state sensing devices, such as Hall effect, magnetoresistance, magnetotransistor ("magnistor"), magnetodiode, or MAGFET (Magnetic Field Effect Transistor) sensors. Other possible sensors include non-linear cores, having magnetic properties varying with H, magnetometers, flux gate magnetometers, and coils, either encircling or proximate, intercepting flux and having an induced EMF proportional to $d\phi/dt$.

Figure 2:
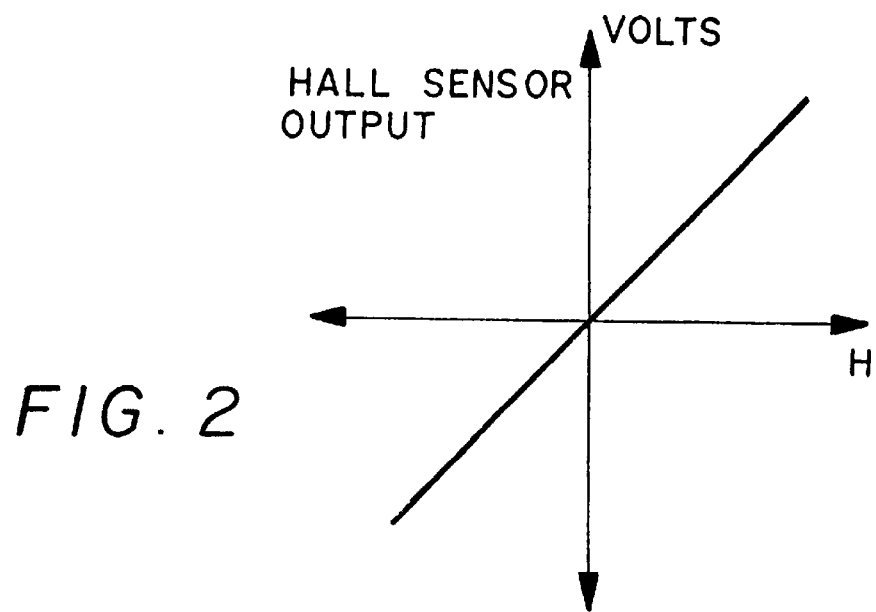
FIG. 2 is a graph showing the linear transfer function of a Hall effect sensor used in the present invention.

The solid state sensors are preferred in this application because of their small size and low cost, and because they can incorporate in an integrated package desirable electronics for temperature compensation, signal conditioning, voltage regulation, and other operational functions. Hall effect sensors are particularly preferred because, as shown in FIG. 2, they have an ideal transfer characteristic which is both linear and polarity-sensitive. Some integrated circuit Hall Effect sensors suitable for use as magnetic field vector sensor 6 are Model TL173C made by Texas Instruments, Model No. AD22150 made by Analog Devices, Models UGN3503U and UGN3503UA made by Allegro MicroSystems, Inc. Similar, potentially suitable devices are also manufactured by MicroSwitch, Siemens, and Wolff Controls Corporation.

Magnetic field vector sensor 6 is located and oriented to produce a maximum response to the external field arising with the transmission of torque. Following from the equivalence of the torqued transducer 4 and an axially magnetized bar magnet, the most intense fields will be found near the poles, i.e., near end faces 18 and 20 of transducer 4. Magnetic field vector sensor 6 is preferably fixed proximate to shaft 8 and does not rotate. Since most major applications of torque transducers involve rotating torqued members such as shaft 8, magnetic field vector sensor 6 must be radially separated from shaft 8 to avoid physical contact with shaft 8 as shaft 8 rotates. While the precise location and orientation of the magnetic field vector sensor 6 will depend on its particular operating principle, package size, active area and other details of construction as well as geometric and magnetic characteristics of transducer 4 (e.g., sharpness of corners, radial thickness, axial length, diameter) and the required radial space, an approximately optimum location for magnetic field vector sensor 6 will usually be found radially outward from one of the end faces 18 and 20, oriented to sense radial flux.

A major advantage of the present invention lies in the fact that any circumferential inhomogeneity occurring in transducer 4 is of much smaller magnitude compared, for example, with inhomogeneity in prior art torque transducers using local sensors. Such sensors sense only a small local region (a spot) on the shaft surface, while the magnetic field vector sensor 6 used here senses the axial field from a region extending the full axial length of the transducer 4. Thus, magnetic field vector sensor 6 averages local moments developed from the many domains along a line, rather than sensing a single point on a line.

Another significant advantage of the sensing in the present invention is that the field sensed by magnetic field vector sensor 6 is modulated only by the direction and magnitude of the transmitted torque. Under conditions of steady torque there is no temporal variation in this field. Thus, unlike the great majority of prior art torque transducers in which the sensed flux is cyclically driven by an alternating polarity, high frequency magnetomotive force, the torque information from the subject transducer resides entirely in the instantaneous flux density, and not in features of a periodic wave carrier or its time rate of change. This allows the use of solid state magnetic sensors 6 which provide electrical outputs proportional to B (flux density) or H (field intensity), since sensor 6 is in an air gap where $\mu$ (permeability)=1. Solid state magnetic sensors are smaller, structurally simpler, and less expensive than coil-type field sensors.

As noted previously, although it is an advantage of the present invention that coils are not required, magnetic sensors 6 using coils can be used with transducer 4 in appropriate applications. Small, flux gate (saturable core) or similar types of field sensors can be used, especially where environmental conditions are too extreme for currently available solid state devices. Flux linkage types of field sensors are also usable but, since these will require integrator circuits to change the dØ/dt signal to Ø, they are less preferred.

Transducer Construction

The construction of an effective transducer 4 according to the present invention requires proper dimensioning, proper material selection, and proper orientation of magnetization in transducer 4.

First, exemplary dimensioning of transducer 4 will be discussed in detail. In one illustrative and preferred example, for a ½" diameter shaft, transducer 4 may be ½" long along its central longitudinal axis, of 18%-Ni maraging steel (T-250), with a 0.499 to 0.498 inch central hole to provide a force fit on shaft 8, and with wall thickness in the 0.030–0.050 inch range. However, the dimensions of transducer 4 may vary in particular application, according to the following general precepts.

A relatively thin wall thickness is usually desirable for transducer 4. The stress in transducer 4 will vary linearly from zero at the center (if transducer 4 is a solid cylinder) or some larger value at inner surface 22 to a maximum at outer surface 24. It would be possible to make a transducer 4 in the form of a solid cylinder, which could be interposed in a break in shaft 8. However, a solid cylindrical transducer 4 would use material inefficiently both mechanically and magnetically. Not only would the center portion transmit little torque, but also the gradient in the axial magnetization component, which is highest on the surface, means that some surface flux would be diverted in an attempt to more axially magnetize the inner material, reducing the amount of flux available for measurement by magnetic field vector sensor 6.

At the other extreme, if transducer 4 is too thin there will be an insufficient volume of material contributing to the external magnetic field. The field is proportional to the magnetic moment from which it arises and the magnetic moment=MV, where M is the axial component of magnetization and V is the volume of material so magnetized.

The axial length of transducer 4 will depend in part on the thickness of the shaft. A cylinder with its axial length disproportionately smaller than its diameter will be difficult to assemble onto and attach to shaft 8. For example, if the transducer 4 is held on the shaft by an interference fit, the fit can be tighter if the transducer 4 is thicker and longer.

If the axial length is too short, the magnetization will be unstable. As noted previously, the torsionally stressed transducer 4 produces an equivalent field to that of a bar magnet having a pole at each end. The closer these poles are to each other, the more intense is the internal "demagnetizing field" of the magnet. There are three energy terms influencing the orientation of magnetization of transducer 4: (1) anisotropy of the material tends to keep the magnetization circumferential; (2) magnetoelastic forces tend to align magnetization in a 45° helix; and (3) the demagnetizing field tends to reduce the axial component of the magnetic field.

The demagnetizing field increases with the axial component of magnetization. Thus, the demagnetizing field grows as magnetoelastic forces overcome the anisotropic forces. The demagnetization factor (a number generally falling between 0 and 4*PI) grows with decreasing axial length and (not as quickly) with increasing thickness. At the other extreme, if the transducer 4 is overly long, a much larger external magnetic structure will be required to close the magnetic circuit through a local field sensor. For small shafts, a width roughly equal to the diameter of the shaft is a good starting point for the design.

Material selection for making transducer 4 is critical, and materials should be selected by matching properties of available materials with the performance requirements of the transducer application and in conjunction with selection of the materials for shaft 8. In the most preferred embodiment, the transducer 4 is constructed of nickel maraging steel such as 18% nickel maraging steel.

The material selected must be ferromagnetic to assure the existence of magnetic domains and must be magnetostrictive in order that the orientation of the magnetization may be altered by the stresses associated with an applied torque.

Materials other than nickel maraging steel may also be appropriate depending on the characteristics of the application. Materials should be chosen in view of the following general criteria.

In the transducer application, the field which arises with the torque is due to the discontinuity in the axial component of magnetization at the two ends of the active region. These ends effectively become the poles of a bar magnet. This field will increase with the saturation magnetization, $M_s$, of the active material. The larger that $M_s$ becomes, the larger the discontinuity. Formally, divH=−divM=(in the limit) −0.7071 div$M_s$), where 0.7071=sin 45°.

The polarization is maintained against disturbing fields by the quiescent anisotropy $K_u$. Therefore, a larger $K_u$ is preferable. However, the magnetization is reoriented by stress more easily (requiring less torque) when Lambda$_s$/$K_u$ is large, where Lambda$_s$ is the saturation magnetostriction. Therefore, if high sensitivity is desired, Lambda$_s$ should be large relative to K$_u$. If a large dynamic range is desired, Lambda$_s$/K$_u$ should be small enough for 3(Lambda$_s$)(Sigma)/K$_u$ to stay within the linear range at the highest required torque.

Other materials that substantially fulfill these criteria and therefore may be used to construct transducer 4 include the following:

Other nickel maraging steels.

Other nickel-iron alloys, including both binary alloys and steels. The binary alloys must include higher nickel (40%–50%) alloys, while steels may include 9-4-20 or AISI 9310.

Aluminum maraging steels that typically contain 13% aluminum, such as Alfer (13% Al—Bal Fe).

Manganese maraging steels that have the advantage of being less expensive than nickel maraging steels.

Permendur type alloys, such as 49 Co 49 Fe 2 V, with very high magnetostriction. Vanadium can be added to make the material easier to work with and to increase its strength. Similar alloys with a lower cobalt content may be used.

Martensitic stainless steel, including straight chromium types such as 410, 416 or 440.

Ferritic stainless steel, such as AISI 430.

Precipitation hardening stainless steel, such as 15-5 PH or 17-4 PH.

Amorphous and nanocrystalline materials.

Transducer 4 can be constructed in its basic shape from the selected material by any suitable material working process. Following formation of transducer 4, two steps are performed to impose the desired circumferential magnetic field orientation on the material of transducer 4. First, transducer 4 is endowed, by prior processing or as a collateral effect of its attachment to shaft 8, with an effective uniaxial magnetic anisotropy having the circumferential direction as the easy axis. Second, transducer 4 must be polarized in one or the other circumferential direction.

The first step in setting up the required magnetic field orientation is to impose circumferential quiescent magnetic anisotropy on the structure of transducer 4. To obtain efficient use of all of the magnetic domains, i.e., the entire volume of transducer 4, the quiescent anisotropy in each should not depart more than 45 degrees from the circumferential direction. For every magnetic domain to work with equal effectiveness and symmetrically for both clockwise and counterclockwise torque, they should all be purely circular, i.e. precisely in the circumferential direction. However, absolute perfection in this regard is not required to obtain good operating results; it is necessary only that the magnetic orientation in each domain be within 45 degrees of ideal.

Magnetic anisotropy is preferably produced by physical working of the material of transducer 4. Any physical source of magnetic anisotropy can be used, alone or in combination, to attain the desired distribution of quiescent domain orientations, being circumferential within plus or minus 45°. One source of magnetic anisotropy is magnetocrystalline i.e., "crystal anisotropy," which refers to the preferred orientation of the magnetic moments ("spins") of the atoms (ferromagnetic atoms) in directions correlated with the axes which define the crystal structure. A second source of magnetic anisotropy is directional order, which refers to the distribution of atomic species, lattice defects, inclusions (exclusions) or other chemical or structural features found in one direction (or more than one, but not all). A third source of magnetic anisotropy is magnetoelastic, which is associated with the directionality of stress in materials having a spontaneous magnetostrictive strain correlated with their spontaneous magnetic moment (magnetostriction-ferromagnetic). A fourth source of magnetic anisotropy is shape of the material, which is associated with the divergence of M at material boundaries. Specifically, a demagnetizing field arises from the "poles" of a magnetized body, and is more intense if the poles are closely spaced. Shapes other than spherical shapes inherently have some axes which are magnetically "easier" than others.

Any or all of these physical sources of anisotropy can be used in constructing transducer 4. As an example, crystal texture arises from various combinations of mechanical working and heat treating. Mechanical working, such as rolling, tends to align the crystals since they have anisotropic strengths and stiffness. Thus, the desired magnetic anisotropy could be introduced by cold rolling transducer 4 between two closely spaced working rollers rotating about axes parallel to the central longitudinal axis of transducer 4. Another method of achieving the desired anisotropy would be to construct transducer 4 by mechanically rolling a continuous, narrow strip of the material of transducer 4 in its longitudinal direction, and then forming transducer 4 by spirally wrapping the strip about shaft 8 using an adhesive to hold the strip in place. Subsequent heat treatment of previously rolled materials causes recrystallization, with crystal growth in directions reflecting the rolling direction, so that the desired anisotropy is enhanced. As another example, the outer surface 24 of transducer 4 can be rolled (or machined) to have a series of circumferential ridges and troughs (a circumferential knurl) in order to develop shape anisotropy (with or without stress anisotropy).

While the aforementioned methods may be particularly useful in certain applications, a preferred embodiment of the invention provides that the transducer 4 be assembled to the shaft with a "press fit," "shrink fit," or other type of "interference fit" wherein the inside diameter of the transducer 4 is made smaller than the outside diameter of the shaft at the interface. This construction places the transducer 4 into circumferential tension (referred to as "hoop stress"). If the transducer 4 is fabricated from a material having a positive magnetostriction, this tensile stress will inherently provide the desired circular anisotropy. This method is particularly advantageous since the magnetic anisotropy can be generated as an inherent function of machine assembly, eliminating the need for a prior processing step to establish directional magnetic anisotropy in transducer 4.

In a particularly preferred process, the inside diameter of transducer 4 and/or the outside diameter of shaft 8 can be "adjusted" after assembly to obtain this hoop stress condition, as long as suitable materials are chosen for transducer 4 and/or shaft 8. If transducer 4 is made from maraging steel it will shrink during the aging process. Similarly, if shaft 8 can be made to undergo a martensitic conversion, as by quenching from an elevated temperature, shaft 8 will expand. If the martensite is only moderately tempered, it will remain magnetically hard and thus have a low permeability as required for shaft 8. This shrink-fit of the transducer 4 to shaft 8 inherently produces circumferential hoop stress in transducer 4 which together with its positive magnetostriction provides the desired magnetic anisotropy.

Following the introduction of magnetic anisotropy to transducer 4, transducer 4 must be polarized in the desired direction, either clockwise or counterclockwise about the circumference of transducer 4. Polarizing the transducer 4 (or more generally, the active element) requires the exposure of all portions to a large enough field in the desired circular direction. The required size of the polarizing field is limited by the practical attainment of saturating effects. Use of a larger field does not noticeably change the operation of the properly polarized device. Transducer 4 should be exposed to the field for a sufficient period of time for the desired polarizing effects of the field to take place, for eddy currents to die down, and so that nothing more happens if the field is maintained for a longer time. FIG. 5a illustrates the effect of increasing the polarizing field from point A to B to C to point D, and the resulting increase in remanent magnetism $M_R$ from A to B to C to D. As shown in FIG. 5b, at some level $H=H_{SAT}$, $M_R$ becomes effectively saturated so that further increasing H produces no additional increase in $M_R$.

A preferred method of polarizing transducer 4 is shown in FIG. 6. In this method, transducer 4 is polarized by rotating it in the field near two opposite magnetic poles 48 and 49, as provided for example by a horseshoe magnet 50. During the rotation of transducer 4, magnet 50 is moved radially inward close to transducer 4 (which is continuously rotating during the approach of magnet 50) and, after a few rotations to stabilize the effects of magnet 50, magnet 50 is slowly moved away far enough so that it has no further effect on transducer 4 magnetization. The polarity imparted by magnet 50 in this method will be dependent on the orientation of the poles of magnet 50 and is independent of the direction of rotation of transducer 4.

Another preferred method of generating a circularly directed field is by providing a current in an axial direction near transducer 4. For example, a suitable large unidirectional current may be conducted directly through shaft 8, on which transducer 4 is assembled. Alternative, such a current may be conducted through a coaxial conductor passed through the central hole in transducer 4 prior to its assembly on shaft 8. Further, as shown in FIG. 7, a conductor 52 passing a current 54 in a single direction can be wrapped helically about the inside and outside of transducer 4 to form an effective row of conductors proximate to each of the inner surface 22 and outer surface 24 of transducer 4. Current flows in opposite axial directions inside and outside transducer 4 produce additive fields in the same circular directions. Winding this helical pattern and then removing it is a less desired way of polarizing transducer 4. However, for large rings, a magnetizing fixture could be made wherein conductor 52 shown in FIG. 7 is constructed in two parts. In this embodiment, the conductor parts are axially separable by translation along the central longitudinal axis of transducer 4 at a break line 56 to allow insertion of the transducer 4, after which they move toward each other to complete the helical circuit. After completion of the polarization process, the conductor parts are again translated in opposite directions along the central longitudinal axis of transducer 4 to permit removal of transducer 4.

If the single conductor method is chosen, a relatively large current is required, especially for a large diameter transducer 4, since the field at the surface of a long round conductor carrying I amperes is H=2I/10r (H in Oersteds; r is the radius of the conductor in cm). For a transducer 4 of diameter 2 cm (about 0.8 inch):

$$H=2I/(10\times 1\ cm)=0.2I$$

so that 1,000 amps will be required to obtain 200 Oersteds of field. A convenient way to magnetize (polarize) with a conductor 52 in this manner is by controlling current 54 with a "one shot" circuit that allows a single half wave of a 60 Hz alternating current to pass, i.e. the first complete half wave after a switch is closed. Large current pulses could also be obtained from the discharge of a capacitor bank or from the inertia of a free wheeling generator, and through other methods known to those skilled in the art.

As shown in FIG. 8, it is also possible to magnetize transducer 4 with a magnet 53 that is not as wide as the transducer 4 by feeding it axially past the transducer 4 along path 55 while continuously rotating the transducer, and this method will be particularly useful for polarizing a very large transducer 4.

Shaft Construction

The construction of shaft 8 is important to the invention in that shaft 8 should not interfere with the operation of the sensor 2. It is clearly advantageous in the interest of sensitivity to direct as much as possible of the axial flux, which arises from the torque, through the magnetic field vector sensor 6. Shaft 8 and transducer 4 should be designed to work together to maximize the permeance of flux closure paths through the sensor while minimizing the permeance of all parallel paths. Thus it is important to avoid having high permeability materials either axially or radially proximate to the edges 18 and 20 of transducer 4. In general, magnetically permeable material of shaft 8 should not be permitted to create a magnetic path at transducer 4. This limitation can be achieved in several ways. Referring again to FIG. 1, in a preferred embodiment, shaft 8 is constructed of low permeability (i.e. paramagnetic) material and transducer 4 is mounted directly to shaft 8. In another embodiment, as shown in FIG. 9, shaft 8 is ferromagnetic and a low permeability spacer 60 is disposed between shaft 8 and transducer 4. In a further embodiment illustrated in FIG. 10, shaft 8 has substantially smaller diameter in region 62 proximate to transducer 4, or (as shown) shaft 8 is entirely cut away in region 62. In either case, a connecting sleeve 64 of low permeability material is provided to bridge the gap created by the cutting away of shaft 8. Transducer 4 is then mounted on connecting sleeve 64.

It should be emphasized that proper operation of devices installed using the methods of FIGS. 9 and 10 requires that there be no slippage between any of the components at their interfaces. Each assembly must act as one body over the entire rated torque range. That is, transducer 4 must be attached to the torqued member in such a way that the surface shear strain of their interface is the same on both, i.e., no slip.

Somewhat less obvious, but no less important, is the requirement that there be no inelastic strain in shaft 8 in any cross section which includes the transducer 4. Thus, all strains associated with the transmission of torque must be fully recoverable when the torque is relaxed. Since any plastic strain occurs by slippage between atomic planes or similar events, this requirement is simply an extension of the more obvious restriction on intercomponent slippage. If slippage on any scale occurs the stress in the transducer 4 will not represent the torque applied to the shaft. Moreover, there will be a distribution of residual stress over the cross section when the torque is relaxed to zero, with the transducer 4 or portions thereof in a reversed stress condition. Slippage will be manifested as a negative hysteresis in the transfer function of the transducer.

Each of these constructions also allow the transducer 4 to be pressed or shrunk on an immediately underlying component. If a dominantly circular anisotropy is to be obtained by a tensile hoop stress this feature is important. If the transducer 4 anisotropy is obtained by means other than circumferential tension, e.g., having been aged or otherwise heat treated in a magnetic field, or under circumferential tension or under axial compression, or if the performance of the device is adequate without this dominant anisotropy, other constructions are possible.

If low permeability shafts are used some attention must be directed to their strength characteristics as well as their thermal coefficients of expansion (relative to the transducer 4). Common austenitic steels (stainless steels) are usually substantially weaker than martensitic steels. Furthermore, since they are single phase materials, they cannot be heat treated to obtain greater strengths. Increasing the yield strength can only be accomplished by cold working, such as rolling, drawing, etc. Extensive cold working can cause a conversion to martensite, which is ferromagnetic.

More desirable materials for low permeability shafts are in the Nitronic family—generally having manganese with little nickel together with chromium. These steels remain fully austenitic under severe cold work and have twice the yield strength of common austenitic steels even in the annealed state. An especially suitable material is Nitronic 32 (or 33) made by Armco. Other potentially suitable materials are various Nickel alloys such as Inconel (International Nickel Co.), Beryllium-copper, and overaged maraging steel. The averaging of this steel causes a reversion to austenite. A particular advantage of overaged maraging steel is its chemical similarity to the material used in transducer 4. This similarity tends to prevent interfacial corrosion.

It may also be possible to use a through hardened, or even a case hardened, carbon or alloy plus carbon steel shaft since such mechanically hardened steels also have low permeabilities.

Attachment of Transducer to Shaft

As already indicated, the transducer 4 and underlying shaft must act as a mechanical unit. Rigid attachment of the transducer 4 either directly or indirectly to shaft 8 is crucial to proper operation of transducer 4. In principle, the transducer 4 need only be attached at the two ends for this requirement to be met.

Methods of attachment may be classified according to the points of force distribution for the transmission of torque along the shaft. The points of force distribution may be either salient, distributed (areal) or diffuse.

Salient force distribution can be achieved by providing mating surfaces on transducer 4 and shaft 8 having mutually engaging profiles, such as a non-round shaft engaging a matching polygonal or elliptical hole in the transducer 4. As shown in FIG. 11, matching internal and external splines, knurls, or teeth 66 can be cut on the inner surface 22 of transducer 4 to mate with similar structures cut onto shaft 8. FIG. 12 shows another embodiment of this concept in which teeth 68 are cut into the edges 18 and 20 of transducer 4. Mating teeth 70 are also cut into the ends of two segments of shaft 8 (one shown), and a projection 72 is provided on shaft 8 to mate with the center hole in transducer 4. When transducer 4 is assembled to the two segments of shaft 8, teeth 70 mate with teeth 68 to render the shaft 8 and transducer 4 relatively rotatively immobile. In other embodiments, keys, pins, or even set screws could be used, although these fastening methods are preferred only for less structurally demanding applications.

Distributed transmission of forces can be achieved by friction or adhesive bonding of transducer 4 to shaft 8. The joint is subjected to the same shearing stress as that being transmitted. This bonding limits the maximum measurable torque to a lower value than might otherwise be handled by the shaft 8 alone or transducer 4 alone, but is advantageous for other reasons as indicated previously. Press or shrink fits can be used to obtain the desired circular anisotropy, and can provide very substantial gripping forces which as a practical matter will not be broken by expected torques on shaft 8. With clean, degassed (and perhaps deoxidized) surfaces, the effective coefficient of friction can rise without limit and act somewhat like a weld. There are also some anaerobic adhesives which make tight fits tighter by expanding into microscopic crevices when they harden. If temperature and environmental conditions do not prevent the use of adhesives, adhesives can be used with designs of transducer 4 in which the adhered area is large compared to the cross sectional area of either the transducer 4 or the joint. This can be done by creating transducer 4 from a spirally wrapped strip using interlayer adhesive as described previously.

FIG. 13 shows an embodiment of transducer 4 which has a plurality of holes 74 through its radius which can be filled with adhesive to bond transducer 4 to shaft 8.

Referring now to FIG. 14, if shaft 8 is hollow, as might be the case particularly in the embodiment of FIG. 10, transducer 4 can be expanded from within by pressing an oversize mandrel 76 through the hole 78, or alternatively by hydraulic pressure or rolling. Other appropriate expansion methods that can be used are well known in the context of attaching boiler tubes to tube sheets. FIG. 15 shows the assembly of FIG. 14 after mandrel 76 has been pushed through hole 78. As will be recognized, this attachment method is desirable as it tends to expand transducer 4 radially outward, producing desired hoop stresses in transducer 4. If hoop stresses are not desired, a tight expansion fit may be provided only at the ends of transducer 4 by using the shaft 8 structure shown in FIG. 16, which is cut down in region 80 about the axial center of transducer 4.

The torque carrying capability of the joint in FIGS. 14 through 16 can be enhanced if the shaft has axial ridges (knurls) which locally cut into or deform the inside diameter of transducer 4 during expansion.

Diffuse force distribution can be achieved using welds or brazing. Welds can obviously be used at the ends or through perforations in the transducer 4 (as shown in FIG. 13). Spot welds or continuous line (seam) welds or welds over parts or all of the transducer 4 area (forge welding) can also be used. The transducer 4 could also be cast around the shaft in a mold, or sprayed (molten condition), explosively welded, electroplated or created by ion implantation or other surface modification of the shaft surface. Clearly, combinations of these general methods might also be used and might be especially suitable for specific applications.

Thus, a novel and improved method of sensing torque on a rotating shaft has been disclosed. In the first step of the method according to the present invention, a transducer 4 according to the present invention is constructed and attached about the circumference of a machine shaft 8 by one of the methods disclosed previously. Either before attachment or during the process of attachment, as described previously, transducer 4 will be endowed with the required anisotropic magnetic properties, and can be polarized as described previously at any time thereafter. The shaft 8-transducer 4 assembly is then installed in the machine. A magnetic field vector sensor 6 according to the invention is installed proximate to transducer 4 with an orientation permitting reception of the stress-induced magnetic field of transducer 4.. In operation of the machine, magnetic field vector sensor 6 then provides a signal linearly indicative of torque on shaft 8, and the signal is monitored by a feedback control or other monitoring circuit connected to magnetic field vector sensor 6.

I claim:

1. A method of producing a magnetoelastic torque transducer for attachment to a member to which an axial torque is applied, comprising the steps of:

(a) constructing a transducer from ferromagnetic magnetostrictive material;

(b) endowing said transducer with an effective uniaxial magnetic anisotropy having a circumferential direction as the easy axis; and (c) polarizing the transducer in a magnetizing field in a circumferential direction.

2. The method of claim 1 wherein step (b) is accomplished by creating circumferential tension in said transducer.

3. The method of claim 2 wherein step (b) is performed by attaching the transducer to said member through heat treatment effecting a shrinking action of said transducer onto said member.

4. The method of claim 2 wherein step (b) is performed by creating an interference fit between said member and said transducer whereby said transducer is placed into circumferential tension.

5. The method of claim 4 wherein said transducer is formed in a tubular shape having an inside diameter smaller than the outside diameter of said member and assembling said smaller diameter transducer onto said larger diameter member to create a press fit therebetween.

6. The method of claim 1 wherein said transducer has a longitudinal axis and said magnetic polarization is achieved by rotating said transducer thereabout while being subjected to the magnetizing field near two opposite magnetic poles.

7. The method of claim 1 wherein said magnetic polarization is accomplished by passing a current through a conductor wound toroidally about the transducer.

8. The method of claim 1 wherein said transducer has a longitudinal axis and said magnetic polarization is achieved by passing a magnet in the axial direction across the transducer while said transducer is rotated about its axis.

9. The method of claim 1 wherein step (c) is accomplished by passing a unidirectional current through a conductor arranged coaxially with the transducer.

10. The method of claim 9 wherein the member is conductive and step (c) is accomplished by first assembling the transducer to the member and then passing a unidirectional current through the member to polarize the transducer in the desired direction.

11. The method of claim 10 wherein said transducer polarizing current comprises a specified subportion of a wave of alternating current.

* * * * *

UNITED STATES PATENT AND TRADEMARK OFFICE
CERTIFICATE OF CORRECTION

PATENT NO. : 5,887,335
DATED : March 30, 1999
INVENTOR(S) : Ivan J. Garshelis

It is certified that error appears in the above-identified patent and that said Letters Patent is hereby corrected as shown below:

On the title page, under Item [19] and [75], delete "Garshells" and insert --Garshelis--.

Signed and Sealed this

Twentieth Day of July, 1999

Attest:

Q. TODD DICKINSON

*Attesting Officer*  *Acting Commissioner of Patents and Trademarks*